(12) United States Patent
Kuroda

(10) Patent No.: US 8,564,093 B2
(45) Date of Patent: Oct. 22, 2013

(54) SEMICONDUCTOR DEVICE AND MANUFACTURING METHOD THEREFOR

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 169 days.

(21) Appl. No.: 13/058,423

(22) PCT Filed: Aug. 6, 2009

(86) PCT No.: PCT/JP2009/063925
§ 371 (c)(1),
(2), (4) Date: Feb. 10, 2011

(87) PCT Pub. No.: WO2010/018779
PCT Pub. Date: Feb. 18, 2010

(65) Prior Publication Data
US 2011/0133309 A1   Jun. 9, 2011

(30) Foreign Application Priority Data

Aug. 12, 2008   (JP) .................................. 2008-207878

(51) Int. Cl.
*H01L 27/08* (2006.01)
(52) U.S. Cl.
USPC ............................................. 257/531; 438/15
(58) Field of Classification Search
USPC ............................................. 257/531; 438/15
See application file for complete search history.

(56) References Cited

U.S. PATENT DOCUMENTS 5,798,282 A * 8/1998 Bertin et al. .................... 438/15

FOREIGN PATENT DOCUMENTS

| JP | 09-064274 A | 3/1997 |
| JP | 2004-281633 A | 10/2004 |
| JP | 2005-228981 A | 8/2005 |
| JP | 2005-348264 A | 12/2005 |
| JP | 2006-050354 A | 2/2006 |
| JP | 2006-066454 A | 3/2006 |
| JP | 2006-105630 A | 4/2006 |
| JP | 2006-173986 A | 6/2006 |

OTHER PUBLICATIONS

Noriyuki Miura et al., "Analysis and Design of Transceiver Circuit and Inductor Layout for Inductive Inter-chip Wireless Superconnect"; 2004 IEEE; 004 Symposium on VLSI Circuits Digest of Technical Papaers; pp. 246-249.

(Continued)

*Primary Examiner* — Douglas Menz
(74) *Attorney, Agent, or Firm* — Westerman, Hattori, Daniels & Adrian, LLP

(57) ABSTRACT

The invention relates to a semiconductor device and a manufacturing method for the same, and makes the rejection rate of the product after chips are stacked and mounted sufficiently low, even when the chips are selected in a conventional, simple and inexpensive wafer test.
A first device where a number of first semiconductor chips and a second semiconductor chip for controlling communication between the first semiconductor chips and the outside or communication between the first semiconductor chips are stacked and a second device having at least one third semiconductor chip that communicates with the second semiconductor chip are mounted on a substrate, wherein the third semiconductor chip functions to substitute a first semiconductor chip, there are at least the same number of third semiconductor chips as there are first semiconductor chips that do not operate normally, from among the first semiconductor chips within the first device, and the third semiconductor chips are stacked so as to substitute the functions of the first semiconductor chips that do not operate normally.

8 Claims, 16 Drawing Sheets

(56) References Cited

OTHER PUBLICATIONS

Hiroki Ishikuro et al.; "An Attachable Wireless Chip Access Interface for Arbitrary Data Rate Using Pulse-Based Inductive- Coupling through LSI Package"; 2007 IEEE International Solid-State Circuits Conference 2007; Session 20, TD: Proximity Data and Power Transmission, 20.3; pp. 360-361, with p. 608.

Noriyuki Miura et al., "A 1Tb/s 3W Inductive-Coupling Transceiver for Inter-Chip Clock and Data Link"; 2006 IEEE International Solid State Circuits Conferences; Session 23; Technology and Architecture Directions; 23.4; pp. 11-13.

Noriyuki Miura et al., "A 0.14pJ/b Inductive-Coupling Inter-Chip Data Transceiver with Digitally-Controlled Precise Pulse Shaping" 2007 IEEE International Solid-State Circuits Conference; Session 20; TD: Proximity Data and Power Transmission; 20.2; pp. 358-359; with p. 608.

Noriyuki Miura et al., "A 195Gb/s 1.2W 3D-Stacked Inductive Inter-Chip Wireless Superconnect with Transmit Power Control Scheme" 2005 IEEE International Solid-State Circuits Conference; Sessionl4; TD:Low Power Wireless and Advanced Intergration; 14.5; pp. 264-265; with p. 597.

Noriyuki Miura et al., "An 11Gb/s Inductive-Coupling Link With Burst Transmission"; 2008 IEEE International Soild-State Circuits Conference; Session 15; TD: Trands in Signal and Power Transmission; 15.7; pp. 298-299; with p. 614.

Noriyuki Miura et al., "Cross Talk Countermeasures in Inductive Inter-chip Wireless Superconnect"; 4 pages.

Daisuke Mizoguchi et al.; "A 1.2Gb/s/pin Wireless Superconnect Based on Inductive Inter-Chip Signaling (IIS)"; 2004 IEEE International Solid-State Curcuits Conference; Session 7; TD: Scaling Trends; 7.6; with 10 pages.

International Search Report. (Feb. 11, 2009).

* cited by examiner (PRIOR ART)

(PRIOR ART)

SEMICONDUCTOR DEVICE AND MANUFACTURING METHOD THEREFOR

TECHNICAL FIELD

The present invention relates to a semiconductor device and a manufacturing method for the same, and in particular to a stacked semiconductor device where a number of semiconductor chips, such as semiconductor memory chips, are stacked, and the structure of which allows for a higher yield, as defective chips found during testing after the chips are stacked is substituted with another good chip.

BACKGROUND ART

In recent years, stacked semiconductor memory devices having a large capacity where a number of semiconductor memories are stacked so that the device can be controlled as one semiconductor memory from the outside have been developed. In solid state drives (SSDs) using nonvolatile memories instead of a magnetic hard disc, for example, a number of flash memory chips of the same type are stacked so that the memory capacity can be increased.

FIG. 15 is a schematic diagram showing the structure of an SSD where eight memory packages 82 each having a stack of eight semiconductor memory chips 83 made of a 1 GB NAND flash memory are mounted on a substrate 81 so as to provide a 64 GB NAND flash memory that can be accessed from the outside. In this case a control chip 84 for controlling the operation of the 1 GB NAND flash memories is also mounted on the substrate 81.

The chips in such stacked semiconductor devices are connected and power is supplied through wires. However, it is becoming more and more difficult to connect these wires as the semiconductor devices increase in density and integration.

For this reason, the present inventors proposed communication between mounted stacks of chips and substrates through inductive coupling using coils formed of wires on the chips or wires on printed wiring boards in accordance with a technology for wireless connection between chips stacked in many layers of the above described stacked device or the layered printed wiring boards (see for example Patent Documents 1 to 6 and Non-Patent Documents 1 to 8). According to Patent Document 1, for example, a number of chips are stacked and data communication is made possible between chips through inductive coupling using coils for magnetic field communication.

PRIOR ART DOCUMENTS

Patent Documents

Patent Document 1: Japanese Unexamined Patent Publication 2005-228981
Patent Document 2: Japanese Unexamined Patent Publication 2005-348264
Patent Document 3: Japanese Unexamined Patent Publication 2006-050354
Patent Document 4: Japanese Unexamined Patent Publication 2006-066454
Patent Document 5: Japanese Unexamined Patent Publication 2006-105630
Patent Document 6: Japanese Unexamined Patent Publication 2006-173986

Non-Patent Documents

Non-Patent Document 1: D. Mizoguchi et al, IEEE International Solid-State Circuits Conference (ISSCC '04), Dig. Tech. Papers, pp. 142-243, 517, February 2004
Non-Patent Document 2: N. Miura et al, Symposium on VLSI Circuits, Dig. Tech. Papers, pp. 246-249, June 2004
Non-Patent Document 3: N. Miura et al, "Cross Talk Countermeasures in Inductive Inter-Chip Wireless Superconnect," in Proc. IEEE Custom Integrated Circuits Conference (CICC '04), pp. 99-102, October 2004
Non-Patent Document 4: N. Miura, D. Mizoguchi, M. Inoue, H. Tsuji, T. Sakurai, and T. Kuroda, IEEE International Solid-State Circuits Conference (ISSCC '05), Dig. Tech. Papers, pp. 264-265, February 2005
Non-Patent Document 5: N. Miura, D. Mizoguchi, M. Inoue, K. Niitsu, Y. Nakagawa, M. Tago, M. Fukaishi, T. Sakurai and T. Kuroda, IEEE International Solid-State Circuits Conference (ISSCC '06) Dig. Tech. Papers, p. 424-425, February 2006
Non-Patent Document 6: N. Miura, H. Ishikuro, T. Sakurai and T. Kuroda, IEEE International Solid-State Circuits Conference (ISSCC '07), Dig. Tech. Papers, pp. 264-265, February 2007
Non-Patent Document 7: H. Ishikuro, T. Sugahara and T. Kuroda, IEEE International Solid-State Circuits Conference (ISSCC '07), Dig. Tech. Papers, pp. 360-361, 608, February 2007
Non-Patent Document 8: N. Miura, Y. Kohama, Y. Sugimori, H. Ishikuro, T. Sakurai and T. Kuroda, IEEE International Solid-State Circuits Conference (ISSCC08), Dig. Tech. Papers, pp. 298-299, February 2008

SUMMARY OF THE INVENTION

Problem to Be Solved by the Invention

When a 64 GB flash memory is formed of eight memory packages, as described above, the area for mounting the packages is large, and further reduction in size is required for semiconductor memories mounted in compact, portable electronics.

Thus, sixty-four 1 GB NAND flash memories are stacked in the same package, so that it can be accessed from the outside as a 64 GB NAND flash memory. FIG. 16 is a schematic diagram showing the structure of an SSD on which a memory package 85 having a stack of sixty-four semiconductor memory chips 83 made of a 1 GB NAND flash memory and a control chip 84 are mounted. When sixty-four flash memories are stacked in this manner, it is possible to reduce the area for mounting the chips to approximately ¼.

In accordance with a conventional method for stacking semiconductor chips through wire bonding, however, it is not practical to stack sixty-four chips. That is to say, there are twenty-six wire bonds per semiconductor chip: one for power supply, one for grounding and twenty-four for signals, and thus the total number of wire bonds is 1664 (26×64). In practice it is impossible to reserve space for bonding such a large number of wires within a single package.

Thus, magnetic field communication through inductive coupling through coils according to the above described proposal by the present inventors is important. When magnetic field communication is used, there are three wire bonds per semiconductor chip: one for power supply, one for grounding and one for resetting, for a total number of 192 (3×64), which is more practical.

The height of the stacks is 4.8 mm when the thickness of the semiconductor chips is 60 μm and the thickness of the adhesive is 15 μm, and thus the height after packaging is approximately 6 mm. Meanwhile, the height of conventional packages where eight semiconductors are stacked is approximately 3 mm, and therefore the volume required for mounting the chips is approximately ½ of that with conventional packages, and therefore the structure is appropriate for mounting with high density.

Likewise, the memory capacity of DRAMs can be increased by 32 times by stacking thirty-two DRAM chips. It is also possible to increase the number of multi-core processors by eight times by stacking eight microprocessor chips.

In the case where magnetic field communication is used as the means for communication between semiconductor chips that are stacked as described above, it is necessary for semiconductor chips located at a distance from each other to communicate data through successive signal transfer. The present inventors have also proposed a means for this (in Japanese Patent Application 2008-146248, for example).

In addition, it is necessary to select the desired chip from among the stacked semiconductor chips through magnetic field communication, as well as to make it operate as desired, in order to actually drive the SSD. The present inventor has also proposed a means for this (in Japanese Patent Application 2008-176120, for example).

Furthermore, it is necessary to bond three bonding wires for power supply, grounding and resetting, to the stacked semiconductor chips. The present inventor has also proposed stacking semiconductor chips in slightly different positions in order to prevent the semiconductor chips from being damaged by the impact at the time of bonding (in Japanese Patent Application 2008-146248, for example).

As for technology for connecting chips that are stacked in many layers within stacked devices or layered printed wiring boards with wires, technology using through silicon vias as a means for providing high-density wires in the direction in which the chip is penetrated has been developed, in addition to conventional bonding wiring.

As described above, it is possible to greatly reduce the area and volume required for mounting the semiconductor chips by increasing the number of stacks of semiconductor chips. However, a problem arises as the number of stacks increases, such that the rejection rate of the stacked semiconductor device greatly increases due to defects in the semiconductor chips.

When the rejection rate of semiconductor chips is D ($0 \leq D \leq 1$), the yield of a stacked semiconductor device having N stacked semiconductor chips is $(1-D)^N$, and thus the yield exponentially lowers as N increases. When the rejection rate D is 3% and N is 64, for example, the yield of the device is 14%. As a result, a problem arises, such that the cost of manufacturing the products is high.

In the case where a chip is found to be defective, the defective chip can be exchanged with a good chip. However, it is difficult to exchange defective chips that are stacked and mounted using an adhesive or solder and then wire bonded with a good chip. Therefore, stringent testing of the chips is required before they are stacked and mounted, particularly when there are a large number of layers in the stack. This is the so-called known good die (KGD) issue.

Semiconductor chips are usually tested using a tester, by probing the wafer before it is cut into semiconductor chips, and thus good chips are selected. At present, however, wafer tests are not carried out as precisely as the test for the final product, in order to lower the cost of testing. A circuit for facilitating testing is generally embedded in chips, so that wafer testing can be carried out in a smaller number of test patterns than the test for the final product. The determination as to how precisely the wafers should be tested is made on the basis of the balance between loss from increase in the rejection rate and reduction in the cost of testing.

So far one package has had eight stacked chips, and therefore, if the rejection rate is 3% the yield of the final stacked semiconductor device is 0.97 to the power of eight, or 78.4%, and thus there are few problems with discarding defective stacked semiconductor devices.

In the case where sixty-four semiconductor chips are stacked, however, the yield of the product is too low. Even if the rejection rate is reduced to 1% by testing the wafer with higher precision, the yield is 0.99 to the power of sixty-four, which is only 53%. Furthermore, the cost of testing to lower the rejection rate D is much higher.

Even if the rejection rate D is reduced to 0%, defective bonding wires in the mounted stack cause the rejection rate of the product to lower, and thus a problem remains. In the above described case where magnetic field communication is not used, for example, a total of 1664 bonding wires are required for sixty-four semiconductor chips if one semiconductor chip requires twenty-six bonding wires.

Even if connection of 1664 bonding wires is possible and the rejection rate of bonding is 100 ppm ($10^{-4}$), the yield is 0.9999 to the power of 1664, which is 84.7%.

An object of the present invention is to make the rejection rate of the product after stacking and mounting sufficiently low even when the chips are selected through conventional, simple and inexpensive testing (even when several percent of the chips are defective).

Means for Solving Problem

In the following, the means for solving the problem according to the present invention are described.

(1) In order to solve the above described problems, the present invention provides a semiconductor device where a first device where a number of first semiconductor chips and a second semiconductor chip for controlling communication between the first semiconductor chips and the outside or communication between the first semiconductor chips are stacked and a second device having at least one third semiconductor chip that communicates with the second semiconductor chip are mounted on a substrate, wherein the third semiconductor chip functions to substitute a first semiconductor chip, there are at least the same number of third semiconductor chips as there are first semiconductor chips that do not operate normally, from among the first semiconductor chips within the first device, and the third semiconductor chips are stacked so as to substitute the functions of the first semiconductor chips that do not operate normally.

Thus, a redundant means for making third semiconductor chips substitute for defective chips within the first device, where first semiconductor chips are stacked, is provided, so that the first device can be shipped as a product, without being discarded as defective.

In addition, the second semiconductor chip, which is usually a control chip, is stacked together with first semiconductor chips, and therefore the second device can be mounted in the same location as the control chip, as shown in FIG. 16, and thus the area for mounting can be prevented from increasing. Furthermore, a commercially available stacked semiconductor device of which the number of stacks varies depending on the number of defective chips can be used as a substitute for the second device, and thus it is possible to save the defective first device in an inexpensive structure.

In addition, no redundant first semiconductor chips are stacked, and therefore, in the case where there are a small number of defective chips, none of the first semiconductor chips end up unused, and thus there is no waste, unlike in the case where redundant first semiconductor chips are stacked.

(2) The present invention also provides the semiconductor device according to (1), characterized in that the first semiconductor chips and the second semiconductor chip have a coil for magnetic field communication, so that data is communicated between the first semiconductor chips and the second semiconductor chip, as well as between the first semiconductor chips, as magnetic field communication through inductive coupling of the coils for magnetic field communication, and the first semiconductor chips and the second semiconductor chip are connected to wires for supplying power.

Thus, magnetic field communication is used as a communication between chips, so that the number of bonding wires in the multilayer stack is practical, and it is possible to stack sixty-four semiconductor chips, for example. Stacked semiconductor devices with sixty-four layers that require 1664 bonding wires cannot be implemented according to the prior art, and therefore the structure where third semiconductor chips are used as a redundant means cannot be taken into consideration. Furthermore, the number of layers is limited to eight according to the prior art, which provides a good yield as a whole, and therefore the structure where third semiconductor chips are used as a redundant means cannot be taken into consideration.

(3) The present invention also provides the semiconductor device according to (2), characterized in that there are a greater number of the wires for supplying power than determined by the requirement of power consumption.

Thus, the yield of the stacked semiconductor device can further be increased, by providing redundant wires for supplying power.

(4) The present invention also provides a semiconductor device according to (3), characterized in that each of which the first semiconductor chips has a wire for resetting the communication state of the coil for magnetic field communication provided in the first semiconductor chip and a redundant wire for resetting which functions to substitute the wire for resetting.

Thus, the yield of the stacked semiconductor device having wires for resetting can further be increased, by providing a redundant wire for resetting. This is possible because the number of bonding wires in multilayer stacks is practical when magnetic field communication is used as the communication means between the above described chips, and this structure cannot be taken into consideration for conventional stacked semiconductor devices having 1664 bonding wires.

(5) The present invention also provides the semiconductor device according to any of (1) to (4), characterized in that the first semiconductor chips and the third semiconductor chips are semiconductor memory chips.

(6) The present invention also provides the semiconductor device according to (5), characterized in that the semiconductor memory chips are nonvolatile memories.

Such a stacked semiconductor device is typically an SSD where semiconductor memory chips, particularly nonvolatile memories, are stacked.

(7) The present invention also provides the semiconductor device according to any of (1) to (6), characterized in that the first semiconductor chips have the same structure.

When magnetic field communication is used, as described above, it is not necessary for individual semiconductor chips to have an identification mechanism, and therefore it is possible to use semiconductor chips having the same structure.

As a result, it is not necessary to take the order in which semiconductor chips are stacked into consideration, and therefore the stacking process is simple.

(8) The present invention also provides a manufacturing method for a semiconductor device according to which a first device where a number of first semiconductor chips and a second semiconductor chip for controlling communication between the first semiconductor chips and the outside or communication between the first semiconductor chips are stacked is mounted on a substrate, characterized in that in the case where some of the first semiconductor chips do not operate normally in the first device, a second device where the same number of third semiconductor chips that function to substitute a first semiconductor chip as the first semiconductor chips that do not operate normally are stacked is mounted on the substrate, and the second semiconductor chip and the third semiconductor chips are connected so as to make communication possible between the second semiconductor chip and the third semiconductor chips.

Thus, first semiconductor chips can be substituted with third semiconductor chips after the completion of the first device, and therefore the rejection rate of the product after chips are stacked and mounted can be made sufficiently low, even when the chips are selected through a conventional, simple and inexpensive wafer test.

Effects of the Invention

According to the proposed semiconductor device and manufacturing method for the same, defective chips can be substituted with redundant chips after the formation of the stacked semiconductor device, and therefore the rejection rate of the product after chips are stacked and mounted can be made sufficiently low, even when the chips are selected through a conventional, simple and inexpensive wafer test.

In addition, defective chips can be substituted with redundant chips simply by mounting a second device where a predetermined number of chips are stacked, particularly a commercially available stacked semiconductor device with a small number of chips, and therefore a redundant mechanism can be formed at low cost.

BEST MODE FOR CARRYING OUT THE INVENTION

Figure 1:
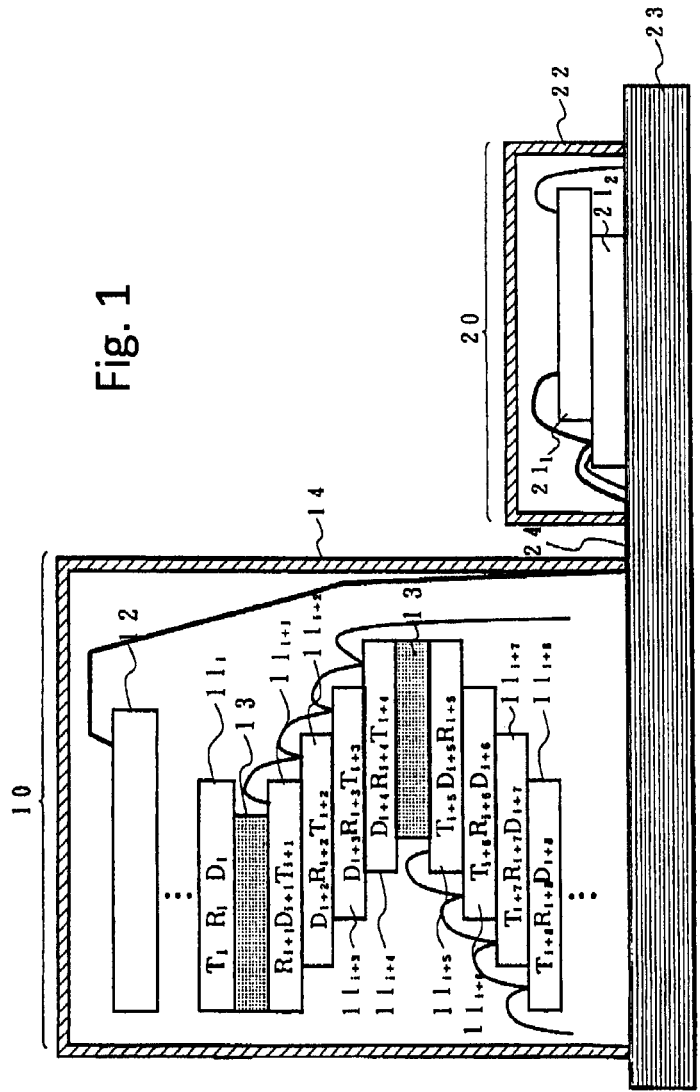
FIG. 1 is a schematic diagram showing the structure of the semiconductor device according to one embodiment of the present invention.

In the following the embodiments of the present invention are described in reference to FIG. 1. FIG. 1 is a schematic diagram showing the structure of a semiconductor device according to one embodiment of the present invention, and shows an example where sixty-four semiconductor chips are stacked. As shown in FIG. 1, semiconductor chips $11_i$ having three coils for magnetic field communication $T_i$, $R_i$ and $D_i$ stacked in slightly different positions, in order to reserve a space for wire bonding, and a controller chip 12 is provided on top (see Japanese Patent Application 2008-146248).

Here, there is a spacer between every four semiconductor chips $11_i$. Each set of four semiconductor chips $11_i$ forms a staircase between spacers, with the direction alternating between every spacer. In the case where sixty-four semiconductor chips $11_i$ are stacked, there are fifteen spacers 13.

In addition, the three coils for magnetic field communication $T_i$, $R_i$ and $D_i$ are aligned so that the middle coil is small and those on either side large, and the coils have different functions in each layer, cross talk is prevented, and transmission and reception is possible through the spacers 13 in the structure. Here, $T_i$ is a coil for transmission, $R_i$ is a coil for reception and $D_i$ is a coil in an off state (disabled). The figure shows the alignment of coils in the case of top to bottom magnetic field communication, and the state of the coils is switched in the case of bottom to top magnetic field communication.

In addition, one wire for supplying power and one wire for grounding are bonded to each semiconductor chip $11_i$ and the controller chip 12, and each semiconductor chip $11_i$ and the controller chip 12 are connected through a reset line. The stacked semiconductor devices having this structure are sealed in a package 14, and thus a first device 10 is formed.

In addition, a second device 20 is formed of at least the same number of semiconductor chips $21_i$ as there are defective semiconductor chips in the first device 10, which function to substitute semiconductor chips $11_i$, as well as a package 22. The second device 20 is mounted on a substrate 23 together with the first device 10, and the semiconductor chips $21_i$ in the second device 20 are connected to the controller chip 12 in the first device 10 through wires 24 so as to be controlled by the controller chip 12.

In this case the same number of semiconductor chips $21_i$ is stored in the second device 20 as there are defective chips in the first device 10. After the number of defective chips within the first device 10 is confirmed, a second device 20 in which the same number of semiconductor chips $21_i$ as there are defective chips are stacked and stored is selected and mounted on the substrate 22. The second device 20 may be a commercially available, inexpensive multipurpose product, or fabricated separately by stacking semiconductor chips having a magnetic field communication mechanism. In the case where a device having less popular number of semiconductor chips and not developed is necessary, a device having a greater number of semiconductor chips may be used. In the case where a device having three semiconductor chips is not available, for example, a device having four semiconductor chips may be used.

As described above, in the embodiments of the present invention the number of defective chips within the first device 10 is confirmed, and then a second device 20 in which the same number of semiconductor chips $21_i$ as there are defective chips are stacked and stored is provided in order to substitute the function, and therefore the yield of the product can be increased without wasting chips. In addition, the mechanism for substitution is simple, and there are no problems even when chips are selected in a conventional, simple and inexpensive wafer test, and therefore the cost of manufacture can be kept low.

In the case where two chips from among sixty-four semiconductor chips $11_i$ are found to be defective during testing after the first device 10 is assembled, for example, the controller chip 12 can access two good semiconductor chips $21_i$ within the second device 20 instead of these defective chips. In addition, in the case where one semiconductor chip $11_i$ is found to be defective, a second device 20 in which one good semiconductor chip $21_i$ is stored is mounted and connected.

In many cases, packages storing one or two semiconductor chips $21_i$, particularly NAND flash memory chips, are manufactured as a different product. The semiconductor device can be efficiently produced using such a package. The packages are easy to use when their sizes are standardized. The efficiency of production is high, because a second device 20 in which a necessary number of good semiconductor chips 21, are stored can be mounted in accordance with the results of the test for the first device 10.

In the case where the rejection rate of the semiconductor chips $11_i$ is 3%, for example, the yield of the first device having a stack of 64 chips is 0.97 to the power of sixty-four, which is 14%. In addition, the probability of one semiconductor chip being defective is $0.97^{63} \times (1-0.97) \times {}_{64}C_1 = 28\%$, and the probability of two semiconductor chips being defective is $0.97^{62} \times (1-0.97)^2 \times {}_{64}C_2 = 27.5\%$. Accordingly, if 10,000 first devices are manufactured, 1400 devices are good devices, 2800 devices have one defective semiconductor chip, and 2750 devices have two defective semiconductor chips.

In the case where second devices where one semiconductor chip or two semiconductor chips are contained in a package are prepared and the controller chip 12 within the first devices 10 uses it as a substitute for a defective chip within the first device 10 and the rejection rate of the semiconductor chips 21, is 3%, 2800/0.97=2887 chips are required to obtain 2800 packages of one good chip. In addition, 2×2750/0.97²=5845 chips are required to obtain 2750 packages of two good chips. Accordingly, the final yield can be calculated as:

$$\{64 \text{ chips} \times (1400+2800+2750) \text{packages}\}/(64 \text{ chips} \times 10{,}000 \text{ packages} + 2887 \text{ chips} + 5845 \text{ chips}) = 69\% \quad \text{[Formula 1]}$$

Thus, the yield is approximately 69%.

If the yield is calculated in this manner, the upper limit of defective chips to be substituted is 42% for one chip, 69% for two chips, 85% for three chips and 93% for four chips. Accordingly, the yield is higher when a second device having a larger number of stacked chips is used.

In addition, the stack structure in the present invention is not limited to that shown in FIG. 1, and each alternating semiconductor chip may be positioned 180° in the opposite direction, as shown in Japanese Patent Application 2007-305143. In addition, the stack structure may be provided using through silicon via technology for providing wires with high density in a direction perpendicular to the chips without using magnetic field communication.

In addition, the yield of manufacture can be increased by providing one redundant bonding wire for at least one of the three bonding wires for power supply, grounding and resetting that are connected to each semiconductor chip. The yield of manufacture can further be increased when there is an additional bonding wire for each of the three bonding wires for power supply, grounding and resetting.

In the case where there are redundant bonding wires for one package where sixty-four semiconductor chips are stored, the required number of bonding wires is 64 (number of chips)×3 (number of required wires)×2 (for redundancy)=384. When the rejection rate of the bonding wires is 100 ppm ($10^{-4}$), one out of every 10,000 bonding wires is defective.

In the case where there is no redundancy, 192 bonding wires are used per package, and therefore one out of 10,000/192=52.083 is defective due to bonding on average. When defective packages are discarded, the yield is 51.083/52.083=98.08%.

In most cases defects in bonding wires are open defects, and therefore the rejection is lower if more than the necessary number of bonding wires is used. In the case where each bonding wire has a redundant wire and the package has 384 bonding wires, the probability of both bonding wires being defective is $(10^{-4})^2$=0.01 ppm. Accordingly, the yield is improved to 99.991% as a result of the same calculation as above.

Such redundancy of bonding wires is provided independently of the redundancy of semiconductor chips.

First Embodiment

Figure 2:
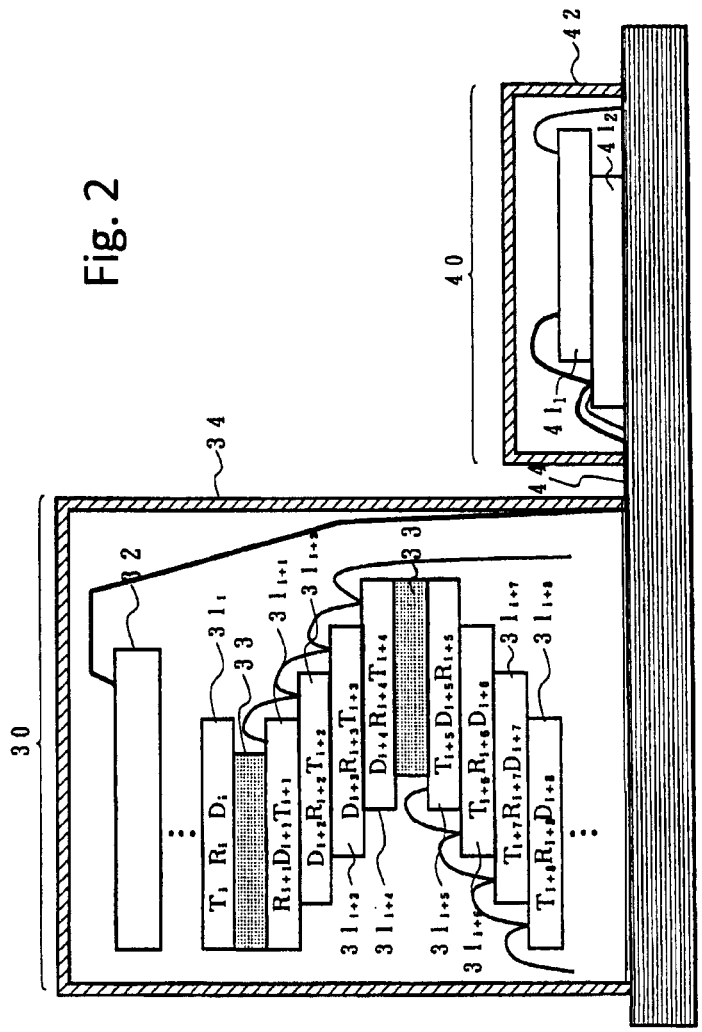
FIG. 2 is a schematic diagram showing the structure of the SSD according to the first embodiment of the present invention.

Based on the above, the SSD according to the first embodiment of the present invention is described below in reference to FIGS. 2 to 8. FIG. 2 is a schematic diagram showing the SSD according to the first embodiment of the present invention, which has the same basic structure as in FIG. 1. As shown in FIG. 2, NAND flash memory chips $31_i$, each having three coils for magnetic field communication $T_i$, $R_i$ and $D_i$ and being as thin as 50 μm, are layered on top of each other using an epoxy resin-based adhesive having a thickness of 15 μm in slightly different positions by 300 μm in accordance with the pitch of the coils for magnetic field communication, and a controller chip 32 having three coils for magnetic field communication $T_i$, $R_i$ and $D_i$ is placed on top.

In addition, one wire for power supply and one wire for grounding are bonded to each NAND flash memory chip $31_i$ and the controller chip 32, and each NAND flash memory chip $31_i$ and the controller chip 32 are connected through a reset line. The thus formed stacked NAND flash memory device is sealed in a package 34 so that a first memory package 30 is formed.

Here, there is a spacer 33 made of silicone having a thickness of 50 μm between every four NAND flash memory chips $31_i$. Each set of four NAND flash memory chips $31_i$ forms a staircase between spacers 33, with the direction alternating between every spacer. In this structure, each NAND flash memory chip $31_i$ is supported by another NAND flash memory chip $31_{i+1}$ or a spacer 33 directly beneath the point at which a wire for power supply, a wire for grounding or a wire for resetting is bonded to the chip, and therefore the NAND flash memory chip $31_i$ can be prevented from being damaged by the impact at the time of bonding. Accordingly, it is possible to make the thickness of the NAND flash memory chip $31_i$ as thin as approximately 50 μm, as described above.

In addition, a second memory package 40 is formed of NAND flash memory chips $41_i$ having the same functions as the defective NAND flash memory chips $31_i$ in the first memory package 30 and a package 42. The second memory package 40 is mounted on a substrate 43 together with the first memory package 30. The number of NAND flash memory chips $41_i$ stored in the second memory package 40 is the same as the number of defective NAND flash memory chips $31_i$ in the first memory package 30. In addition, the NAND flash memory chips $41_i$ within the second memory package 40 are connected to the controller chip 32 within the first memory package 30 through wires so as to be controlled by the controller chip 32.

Figure 3:
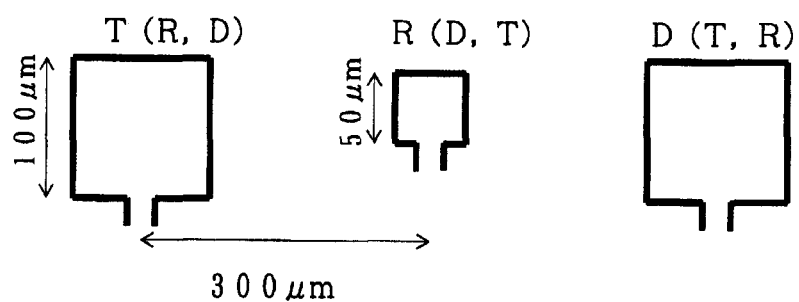
FIG. 3 is a schematic diagram showing the structure of three coils for magnetic field communication T, R and D.
Figure 4:
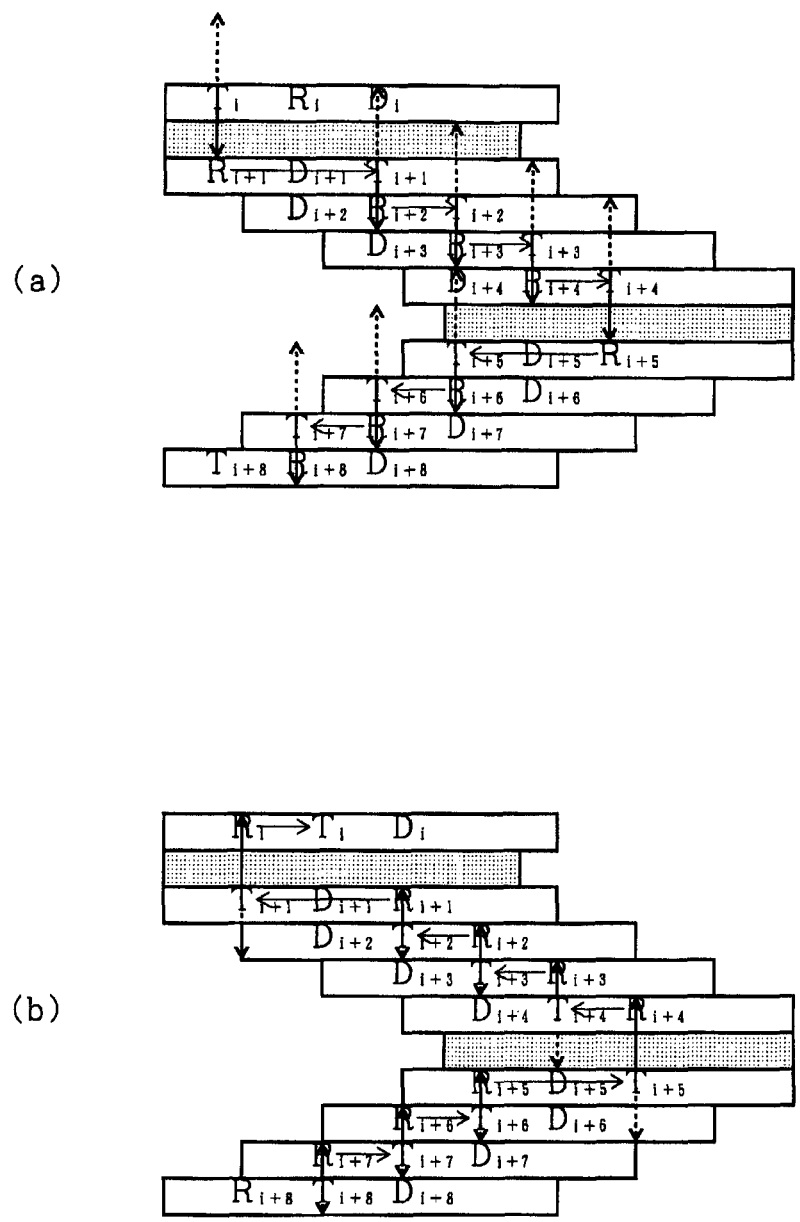
FIG. 4 is a diagram illustrating a method for successive communication between chips.
Figure 5:
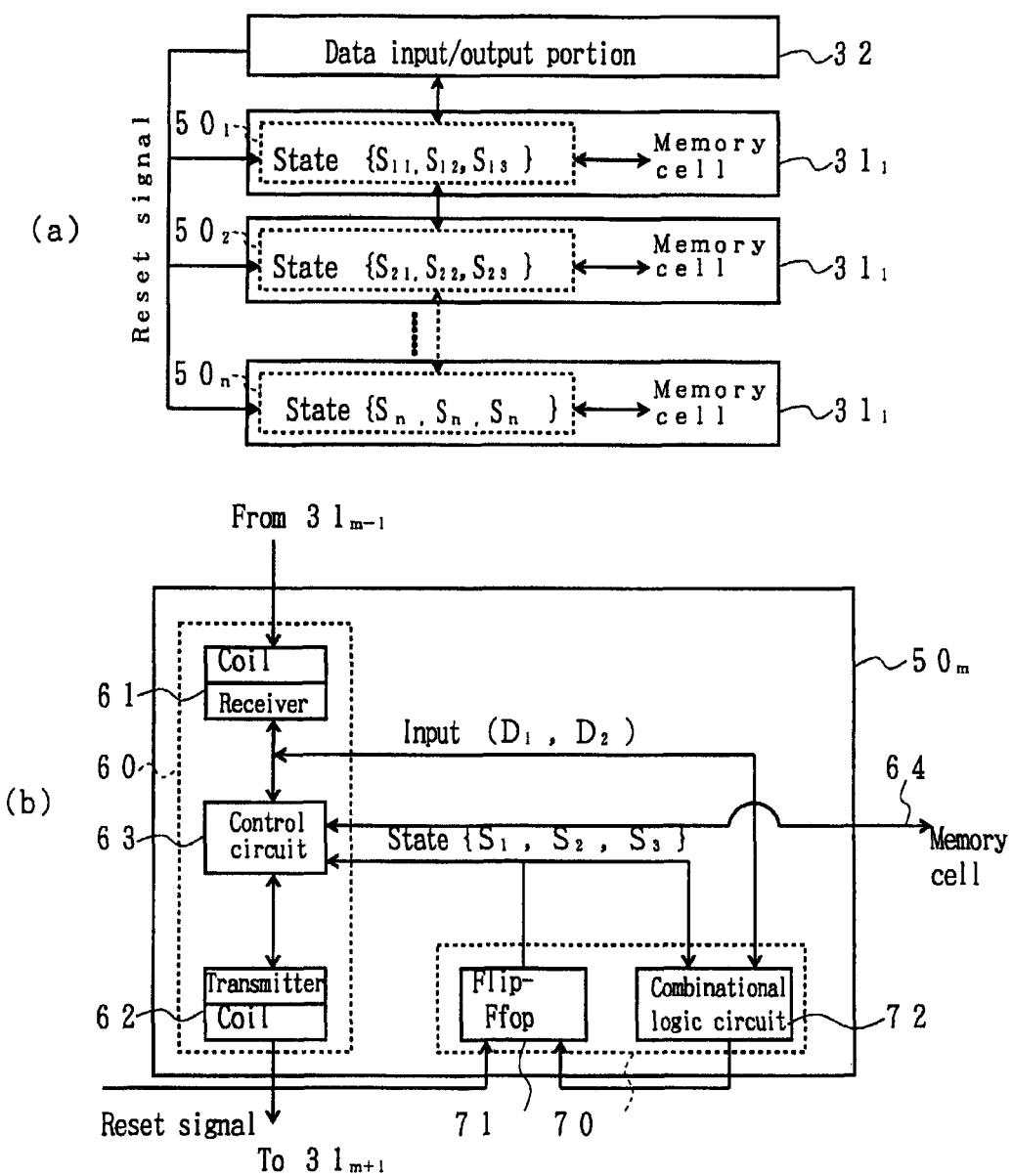
FIG. 5 is a diagram illustrating a method for selecting a memory in the SSD according to the first embodiment of the present invention.

In addition, as shown in FIG. 3, the coils on the two sides of the three coils for magnetic field communication T, R and D are squares of 100 μm and the center coil is a square of 50 μm, and the coils are aligned with a pitch of 300 μm so that the communication capacity is different on both sides in the structure. The three coils for magnetic field communication T, R and D provided in each NAND flash memory chip $31_i$ have different roles in the layer and are formed to prevent cross talk and make transmission/reception possible via the spacer 33. Here, T is a coil for transmission, R is a coil for reception and D is a coil in an off state (disabled).

Next, the method for successive communication between the chips is described in reference to FIGS. 4(a) and 4(b). FIGS. 4(a) and 4(b) are diagrams illustrating the method for successive communication between the chips. FIG. 4(a) shows the case where the operation is repeated downwards (successive transmission), and FIG. 4(b) shows the case where the operation is repeated upwards. The three coils are programmed to any of transmission $T_i$, reception $R_i$ and not used $D_i$, and thus the operation can be repeated downwards or upwards. Programming is possible using bonding wires and an EEPROM.

As shown in FIG. 4(a), in the case of the operation of repeating downwards, the coil in the chip on the upper side facing the coil $T_i$ for transmission in one layer is programmed to be an unused coil $D_i$, and therefore the operation of repeating upwards does not occur. In addition, though the distance between chips with a spacer in between is twice as great, transmission/reception is possible by means of the large-sized coils provided on both sides, and therefore the sensitivity is not low for communication.

In addition, though in this case a large-sized coil is always used as a coil for transmission $T_i$, and therefore there is a possibility that signals may reach chips two or three chips away, there are no coils in the locations corresponding to the coil for transmission $T_i$, or even if there is one, it is an unused coil $D_i$, and thus no cross talk is generated.

As shown in FIG. 4(b), in the case of the operation of repeating upwards, the coil in the chip on the lower side facing the coil $T_i$ for transmission in one layer is programmed to be an unused coil $D_i$, and therefore the operation of repeating downwards does not occur. In addition, though the distance between chips with a spacer in between is twice as great, transmission/reception is possible by means of the large-sized coils provided on both sides, and therefore the sensitivity is not low for communication.

In this case, the small-sized center coil is used as the coil for transmission $T_i$ in the portions other than those with a spacer in between, and therefore there is no possibility of a signal reaching a chip two or three chips away, and thus no cross talk is generated. Provided that the center coil is also large, and thus the signal from the sixth chip from the bottom is large in the figure, there is a risk that the signal will reach the coil for reception $R_{i+5}$ provided in the fourth chip from the bottom, causing the operation of repeating downwards to take place.

The three coils for magnetic field communication $T_i$, $R_i$ and $D_i$ are designed in this manner, and therefore chips having exactly the same specifications can be used as the NAND flash memory chips $31_i$. Thus, it is not necessary to pay special attention to the stacking process, and the stacking process becomes simple.

Next, an example of a method for selecting a memory is described. FIGS. 5(a) and 5(b) are diagrams illustrating a method for selecting the memory in the SSD according to the first embodiment of the present invention. FIG. 5(a) is a schematic diagram showing the structure of a main portion of the SSD, and FIG. 5(b) is a schematic diagram showing the structure of the communication circuit in the memory chip that forms the SSD. Here, the NAND flash memory chips $31_i$ are stacked in the same position in order to simplify the figure.

First, as shown in FIG. 5(a), the stacked NAND flash memory chips $31_i$ are provided with a communication circuit $50_i$ for magnetic field communication, and at the same time are provided with a memory cell having a predetermined capacity and a read/write control circuit (neither are shown). As described above, this communication circuit $50_i$ is provided with three coils for magnetic field communication so that the coil can be switched to one for transmission, one for reception and one to be unused in the configuration.

The receiver circuit within the transmission/receiver circuit in the NAND flash memory chip $31_m$ that is stacked in the mth layer receives a signal from the NAND flash memory chip $31_{m-1}$ and transfers it to the control circuit within the NAND flash memory chip $31_m$. In addition, the transmission circuit in the NAND flash memory chip $31_m$ transmits the data in the control circuit to the NAND flash memory chip $31_{m+x}$. When the NAND flash memory chip $31_m$ is in a transferring state, a signal received by the receiver circuit is transmitted by the transmission circuit, and thus a signal from the NAND flash memory chip $31_{m-y}$ is transferred to the NAND flash memory chip $31_{m+x}$. This transfer is possible since the NAND flash memory chips $31_i$ sandwiched between the NAND flash memory chip $31_{m-y}$ and the NAND flash memory chip $31_{m+x}$ transfer a signal in sequence.

A reset signal is outputted from the control chip 32 via the above described wire for resetting in parallel to the NAND flash memory chips $31_i$. Upon reception of the reset signal, the NAND flash memory chips $31_i$ initialize the communication circuit $50_i$ within the memory chip. The data input/output portion in the control chip 32 faces the coils for magnetic field communication provided in the NAND flash memory chip $31_1$ so as to input/output data.

In the case where a memory cell integrated within a certain NAND flash memory chip $31_m$ in the 64 NAND flash memory chips $31_i$ is accessed, the control chip 32 outputs control data for selecting a NAND flash memory chip $31_m$ through the data input/output portion, and thus sets the NAND flash memory chip $31_m$ in a selective state. Next, the control chip 32 outputs the address of the memory cell to be accessed and the write/read control signal, and thus carries out the write/read of data on the above described address.

As shown in FIG. 5(b), the communication circuit $50_m$ provided in the NAND flash memory chip $31_m$ has a trans-mission/receiver circuit $60_m$ and a sequence logic circuit $70_m$. The transmission/receiver circuit $60_m$ has a receiver circuit portion $61_m$ which inductively couples with the transmission/receiver circuit $60_{m-1}$ in the NAND flash memory chip $31_{m+1}$ in the former stage, a transmission circuit portion $62_m$ which inductively couples with the transmission/receiver circuit $61_{m+1}$ in the NAND flash memory chip $31_{m+1}$ in the latter stage, and a control circuit $63_m$ for controlling the entire communication circuit $50_m$. Here, the coil for magnetic field communication set to be unused (disabled) is not shown in the figure in order to simplify the description.

The sequence logic circuit $70_m$ has a flip-flop $71_m$ for storing the state information for three bits $\{S_1, S_2, S_3\}$ that shows the operational state of the NAND flash memory chip $31_m$ and a combinational logic circuit $72_m$. The combinational logic circuit $72_m$ determines the next operational state of the NAND flash memory chip $31_m$ on the basis of the value of the flip-flop $71_m$ and the control information of two bits $(D_1, D_2)$ transmitted from the NAND flash memory chip $31_{m-1}$ in the former stage by the transmission/receiver circuit $60_m$ and stores the corresponding state information in the flip-flop $71_m$.

The control circuit $63_m$ determines the operation of the NAND flash memory chip $31_m$ on the basis of the state information $\{S_1, S_2, S_3\}$ and controls the entire NAND flash memory chip $31_m$. The control circuit $63_m$ has a signal line $64_m$ for transmitting a control signal for read/write and address information to a memory cell within the memory chip and receiving read data or data to be written in.

Figure 6:
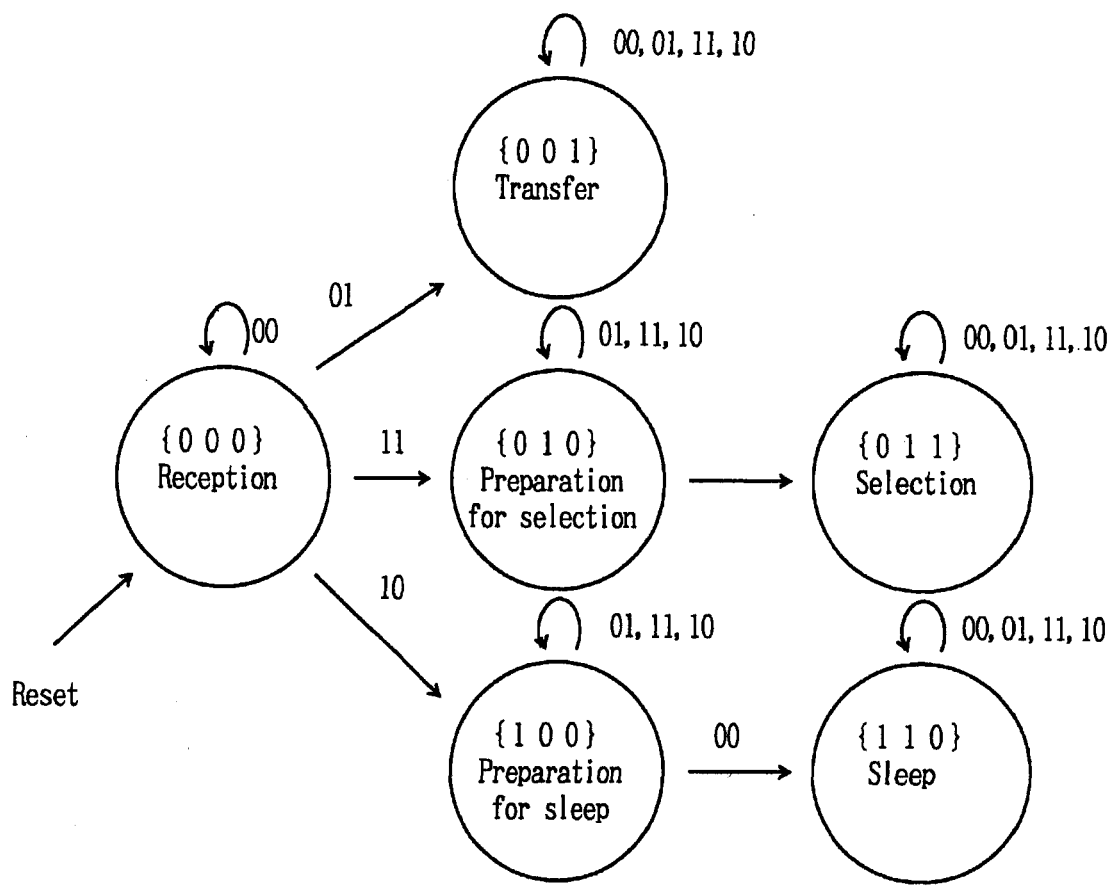
FIG. 6 is a diagram illustrating the transition of states of a sequential logic circuit due to control information ($D_1$, $D_2$) made of 2 bit data.

FIG. 6 is a diagram illustrating how the state of the sequence logic circuit transfers on the basis of the control information $(D_1, D_2)$ made of two-bit data.

(a) Reception State $\{000\}$: the flip-flop 71 is reset on the basis of the reset signal outputted by the control chip 32 so that $\{S_1, S_2, S_3\}=\{000\}$, and the communication circuit 50 becomes of the reception state. The NAND flash memory chip $31_m$ in the reception state transfers the two-bit data $(D_1, D_2)$ received from the NAND flash memory chip $31_{m-1}$ in the former stage (hereinafter referred to as former stage apparatus) to the combinational logic circuit $72_m$. The combinational logic circuit $72_m$ determines the next internal state on the basis of the state information $\{000\}$ and the two-bit data $(D_1, D_2)$. When the two-bit data $(D_1, D_2)$ is (00), the internal state maintains the reception state $\{000\}$. In addition, when $(D_1, D_2)$ is (01), (11) or (10), the internal state transitions to the transfer state $\{001\}$, the selection preparatory state $\{010\}$ or the sleep preparatory state $\{100\}$.

(b) Transfer State $\{001\}$: the communication circuit $50_m$ in the transfer state $\{001\}$ functions as a transfer circuit and transmits the two-bit data $(D_1, D_2)$ received from the former stage apparatus to the NAND flash memory chip $31_{m+1}$ in the latter stage (hereinafter referred to as latter stage apparatus). In addition, the state information is maintained at $\{001\}$ for all pieces of the two-bit data $(D_1, D_2)$.

(c) Selection Preparatory State $\{010\}$: the selection preparatory state $\{010\}$ is a state of the preparatory stage where its own memory chip is transitioned to a selective state that allows for the read/write operation upon reception of the two-bit data (00). When the communication circuit $50_m$ in the selection preparatory state receives the two-bit data (01), (11) or (10) from the former stage apparatus, the state information is maintained at the selection preparatory state $\{010\}$ and transmits the received two-bit data $(D_1, D_2)$ to the latter stage apparatus. Meanwhile, upon reception of the two-bit data (00) from the former stage apparatus, the internal state is transitioned to the selective state (011), which is a state where the memory cell is operable for read/write, and at the same time the two-bit data (00) is transmitted to the latter stage apparatus.

(d) Selective State {011}: the selective state {011} is an operational state that allows for the read/write of a memory cell. The communication circuit $50_m$ that is set to the selective state {011} is not changed in the internal state by the two-bit data ($D_1$, $D_2$) received from the former stage apparatus and does not transmit the received two-bit data ($D_1$, $D_2$) to the latter stage apparatus.

The NAND flash memory chip $31_m$ in this selective state {011} receives the read/write control signal outputted by the control chip 32 and the address signal via the communication path that is set by the control chip 32 when the control chip 32 transmits two-bit data ($D_1$, $D_2$), reads out data from the memory region designated by the address signal in accordance with the received read/write control signal, and transmits the data to the control chip 32 via the set communication path. Alternatively, the data transmitted by the control chip 32 via the set communication path is written in the memory region designated by the address signal.

The NAND flash memory chips $31_i$ (i<m) that are stacked between the control chip 32 and the NAND flash memory chip $31_m$ in the selective state {011} are set to the transfer state {001}. The NAND flash memory chips $31_i$ in the transfer state {001} carry out a relaying process of the addresses and data sent and received between the control chip 32 and the NAND flash memory chip $31_m$ in the selective state {011}.

(e) Sleep Preparatory State {100}: the sleep preparatory state {100} is a state in a preparatory stage where the functions of its own memory chip other than the minimum functions, such as a reset operation, are to be stopped for the transition to the sleep state having a low power consumption upon reception of the two-bit data (00). When the two-bit data ($D_1$, $D_2$) received from the former stage apparatus by the communication circuit $50_m$ in the sleep preparatory state is (01), (11) or (10), the state information is maintained at the sleep preparatory state {100} and the received two-bit data ($D_1$, $D_2$) is transmitted to the latter stage apparatus. Meanwhile, when the two-bit data (00) is received from the former stage apparatus, the internal state is set to the sleep state {110} having low power consumption, and at the same time the two-bit data (00) is transferred to the latter stage apparatus.

(f) Sleep State {110}: the memory chip in the sleep state {110} stops the functions other than the minimum functions such as the reset functions in order to reduce power consumption. The operation of receiving the two-bit data ($D_1$, $D_2$) from the former stage apparatus is also stopped.

Figure 7:
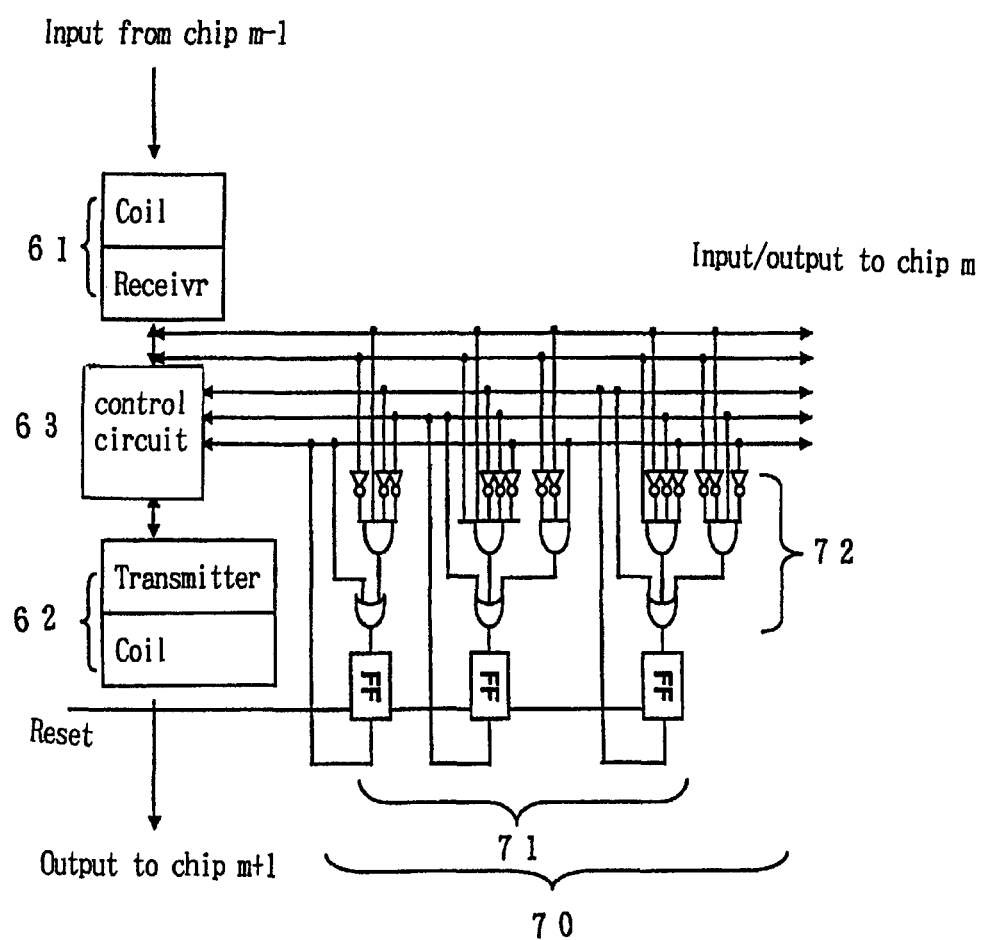
FIG. 7 is a diagram illustrating an example of a sequential logic circuit for the transition of states shown in FIG. 6.

FIG. 7 is a diagram illustrating an example of a sequence logic circuit for implementing the transition of the state shown in FIG. 6. The sequence logic circuit $70_m$ is made of a flip-flop $71_m$ and a combinational logic circuit $72_m$ as described above. The flip-flop $71_m$ is a circuit for storing the state information {$S_1$, $S_2$, $S_3$} and is reset by the reset signal outputted by the control chip 32 to {$S_1$, $S_2$, $S_3$}={0, 0, 0}, that is to say, the reception state {000}.

In addition, the combinational logic circuit $72_m$ carries out a logic operation on the state information {$S_1$, $S_2$, $S_3$} of three bits in the flip-flop $71_m$ and the two-bit data ($D_1$, $D_2$) received from the former stage apparatus by the receiver circuit $62_m$ and holds the results in the flip-flop $71_m$.

Figure 8:
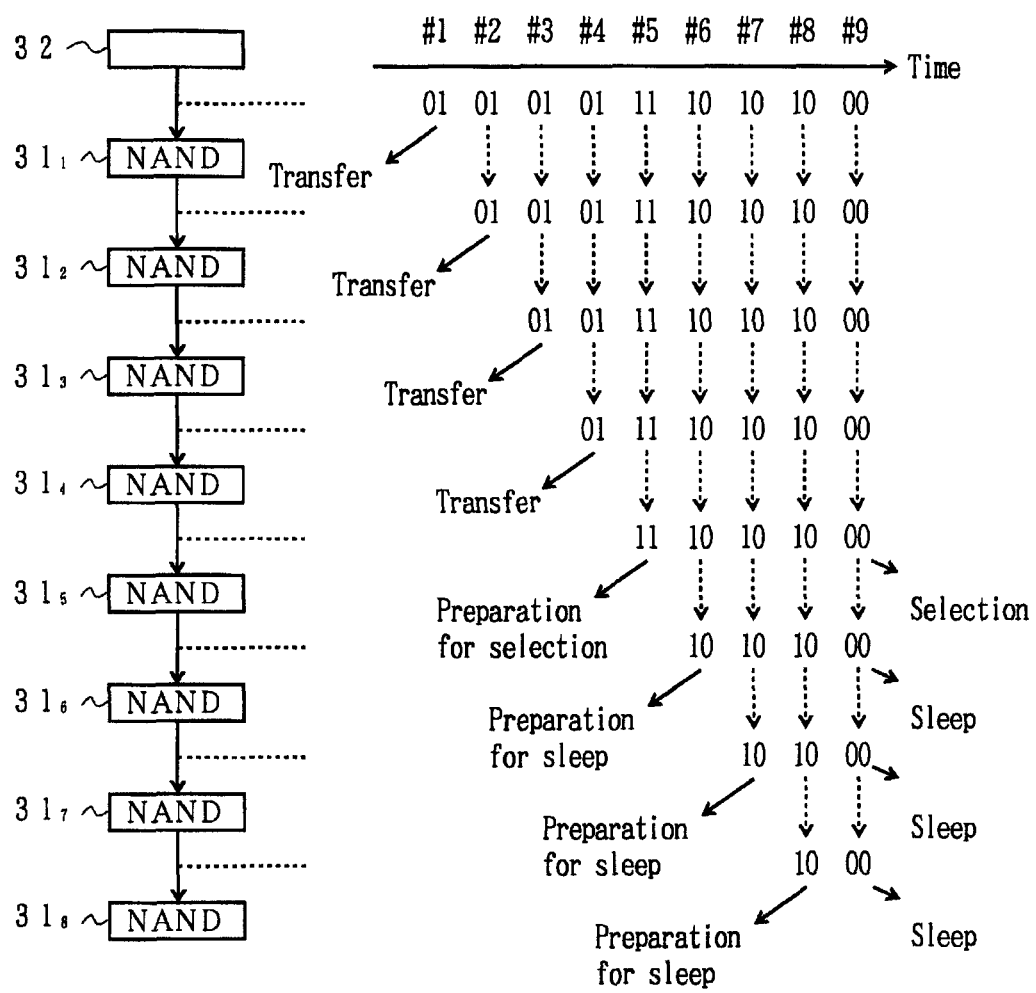
FIG. 8 is a diagram illustrating the procedure for setting a particular memory chip to a selective state in an SSD.

FIG. 8 is a diagram illustrating the procedure for setting a certain memory chip in the SSD to the selective state. Here, a procedure for carrying out the write/read of data on the fifth NAND flash memory chip $31_5$ in a memory system where eight memory chips are stacked is described, which is used as an example to simplify the description.

(A) When the setting of the state of the NAND flash memory chips $31_i$ is started, the control chip 32 transmits a reset signal to all the NAND flash memory chips $31_1$ to $31_8$ so that the memory chips are set to the reception state {000}.

(B) First Step (#1): the control chip 32 transmits the two-bit data (01) in order to convert the NAND flash memory chip $31_1$ to the transfer state {001}. The NAND flash memory chip $31_1$ in the reception state {000} transitions to the transfer state {001} upon reception of the two-bit data (01).

(C) Second Step (#2): the control chip 32 transmits the two-bit data (01) in order to convert the NAND flash memory chip $31_2$ in the next stage to the transfer state {001}. The NAND flash memory chip $31_1$, which is already in the transfer state {001}, transfers the two-bit data (01) to the NAND flash memory chip $31_2$ in the following stage. The NAND flash memory chip $31_2$ in the reception state {000} transitions to the transfer state {001} upon reception of the two-bit data (01).

(D) Third Step (#3): the control chip 32 transmits the two-bit data (01) in order to convert the NAND flash memory chip $31_3$ in the third stage to the transfer state {001}. The two-bit data (01) is transferred to the NAND flash memory chip $31_3$ via the NAND flash memory chip $31_1$ and the NAND flash memory chip $31_2$ that are already in the transfer state {001}. The NAND flash memory chip $31_3$ in the reception state {000} transitions to the transfer state {001} upon reception of the two-bit data (01).

(E) Fourth Step (#4): the control chip 32 transmits the two-bit data (01) in order to convert the NAND flash memory chip $31_4$ in the fourth stage to the transfer state {001}. The two-bit data (01) is transferred to the NAND flash memory chip $31_3$ via the NAND flash memory chip $31_1$ through the NAND flash memory chip $31_3$, which are already in the transfer state {001}, so that the NAND flash memory chip $31_4$ transitions to the transfer state {001}.

(F) Fifth Step (#5): the control chip 32 transmits the two-bit data (11) in order to convert the NAND flash memory chip $31_5$ in the fifth stage to the selection preparatory state {010}. The two-bit data (11) is transferred to the NAND flash memory chip $31_5$ via the NAND flash memory chip $31_1$ through the NAND flash memory chip $31_4$, which are already in the transfer state {001}. The NAND flash memory chip $31_5$ in the reception state {000} transitions to the selection preparatory state {010} upon reception of the two-bit data (11).

(G) Sixth Step (#6): the control chip 32 first transmits the two-bit data (10) for setting the NAND flash memory chip $31_6$ to the sleep preparatory state {100} in order to convert the NAND flash memory chip $31_6$ in the sixth stage, which does not relate to the read/write operation of the NAND flash memory chip $31_5$, to the sleep state {110}. This two-bit data (10) is transferred to the NAND flash memory chip $31_6$ via the NAND flash memory chip $31_1$ through the NAND flash memory chip $31_4$, which are already in the transfer state {001}, and the NAND flash memory chip $31_5$, which is already in the selection preparatory state {010}. The NAND flash memory chip $31_6$ in the reception state {000} transitions to the sleep preparatory state {100} upon reception of the two-bit data (10).

(H) Seventh Step (#7): the control chip 32 first transmits the two-bit data (10) for setting the NAND flash memory chip $31_7$ to the sleep preparatory state {100} in order to convert the NAND flash memory chip $31_7$ in the seventh stage to the sleep state {110}. This two-bit data (10) is transferred to the NAND flash memory chip $31_7$ via the NAND flash memory chip $31_1$ through the NAND flash memory chip $31_4$, which are already in the transfer state {001}, the NAND flash memory chip $31_5$ in the selection preparatory state {010} and the NAND flash memory chip $31_6$ in the sleep preparatory state {100}. The NAND flash memory chip $31_7$ in the reception state {000} transitions to the sleep preparatory state {100} upon reception of the two-bit data (10).

(I) Eighth Step (#8): the control chip 32 first transmits two-bit data (10) for setting the NAND flash memory chip $31_8$ to the sleep preparatory state {100} in order to convert the NAND flash memory chip $31_8$ in the eighth stage to the sleep state {110}. This two-bit data (10) is transferred to the NAND flash memory chip $31_8$ via the NAND flash memory chip $31_1$ through the NAND flash memory chip $31_4$, which are already in the transfer state {001}, the NAND flash memory chip $31_5$ in the selection preparatory state {010} and the NAND flash memory chips $31_6$ and $31_7$ in the sleep preparatory state {100}. The NAND flash memory chip $31_8$ in the reception state {000} transitions to the sleep preparatory state {100} upon reception of the two-bit data (10).

(J) Ninth Step (#9): the control chip 32 transmits two-bit data (00) in order to transition the NAND flash memory chips $31_i$ in the selection preparatory state and in the sleep preparatory state to the selective state {011} and the sleep state {110}. The two-bit data (00) is transmitted to the NAND flash memory chip $31_5$ via the NAND flash memory chip $31_1$ through the NAND flash memory chip $31_4$ in the transfer state {001}. The NAND flash memory chip $31_5$ in the selection preparatory state {010} transitions to the selective state {011} upon reception of the two-bit data (00), and at the same time the two-bit data (00) is transmitted to the NAND flash memory chip $31_6$ in the latter stage. The NAND flash memory chip $31_6$ in the sleep preparatory state {100} transitions to the sleep state {110} upon reception of the two-bit data (00), and at the same time transmits the two-bit data (00) to the NAND flash memory chip $31_7$ in the latter stage. The NAND flash memory chip $31_7$ and the NAND flash memory chip $31_8$ in the sleep preparatory state {100} operate in the same way as the NAND flash memory chip $31_6$ and transition to the sleep state {110}.

Thus, the control chip 32 carries out the steps A through J so that the NAND flash memory chip $31_1$ through the NAND flash memory chip $31_4$ are set to the transfer state {001}, the NAND flash memory chip $31_5$ is set to the selective state {011}, and the NAND flash memory chips $31_6$ through the NAND flash memory chips $31_8$ are set to the sleep state {110}.

After the completion of these settings, the control chip 32 transmits information that is required to access the NAND flash memory chip $31_5$, such as the write/read control information and address information. The NAND flash memory chip $31_1$ through the NAND flash memory chip $31_4$ set to the transfer state {001} carry out a process for transferring data between the control chip 32 and the NAND flash memory chip $31_5$.

When the read/write control signal and the address signal outputted by the NAND flash memory chip $31_5$ and the control chip 32 are received, data is read from the memory region designated by the address signal in accordance with the read/write control signal so as to be transmitted to the control chip 32 via the set communication path. Alternatively, the data transmitted by the control chip 32 through the set communication path is written into the memory region designated by the address signal.

Thus, in the semiconductor device formed of a number of memory chips, which have the same functions and are stacked on top of each other, it is possible to select any memory chip from among the stacked memory chips without adding identification information to the memory chips. Accordingly, it is not necessary to set information for identifying memory chips, such as the order in which memory chips are stacked, and it is possible to stack 64 memory chips.

Thus, in the SSD according to the first embodiment of the present invention, semiconductor memory chips stored in a separate package have redundancy, and therefore even in the case where a memory device is formed of 64 chips stacked on top of each other, the rejection rate of the products after being stacked and mounted can be sufficiently low when chips are selected in a conventional, simple and inexpensive wafer test.

In addition, as described above, a concrete stacking method, a magnetic field communication method without causing cross talk and a chip selection method are sufficiently established technically, and therefore it is possible to implement a memory device having a large capacity.

Second Embodiment

Figure 9:
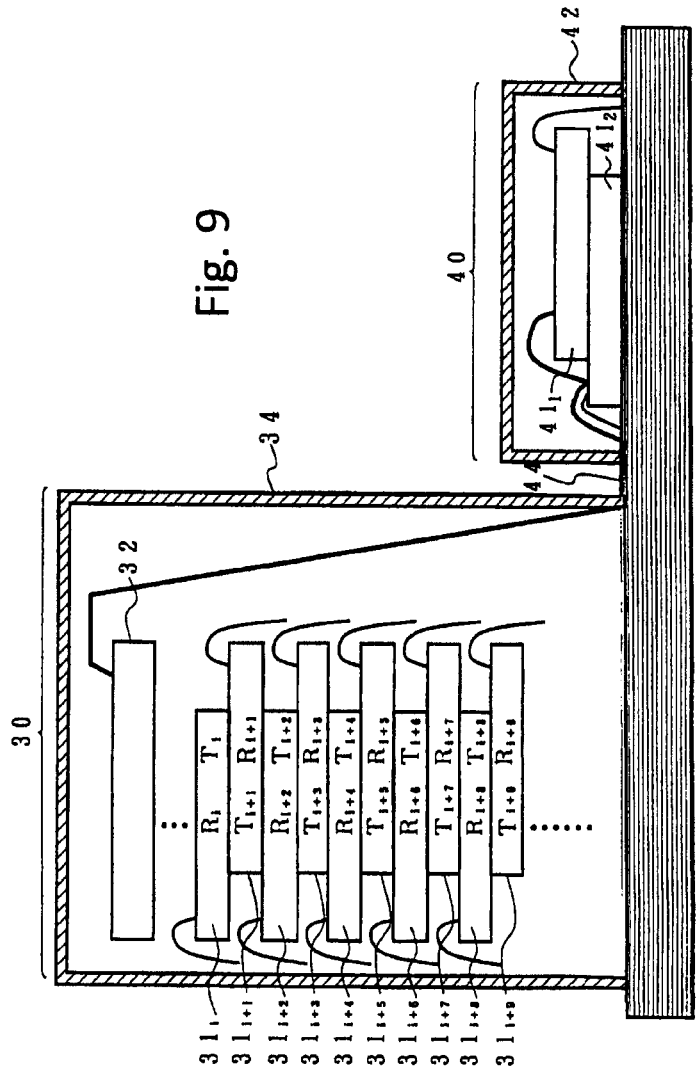
FIG. 9 is a schematic diagram showing the structure of the SSD according to the second embodiment of the present invention.

Next, the SSD according to the second embodiment of the present invention is described in reference to FIG. 9, and the basic structure of the second embodiment is the same as that of the first embodiment except that the method for stacking memory chips is different. FIG. 9 is a schematic diagram showing the structure of the SSD according to the second embodiment of the present invention where the NAND flash memory chips $31_i$ having completely the same specifications are positioned 180° in the opposite direction and stacked on top of each other in slightly different positions so that the axes of the coils for magnetic field communication coincide.

In the case of the second embodiment, no spacers are required, and therefore two coils for magnetic field communication having the same size may be provided. Here, there is no chip directly beneath the point for wire bonding, and therefore it is necessary to pay attention so that the memory chips are not damaged by the impact at the time of wire bonding.

Third Embodiment

Figure 10:
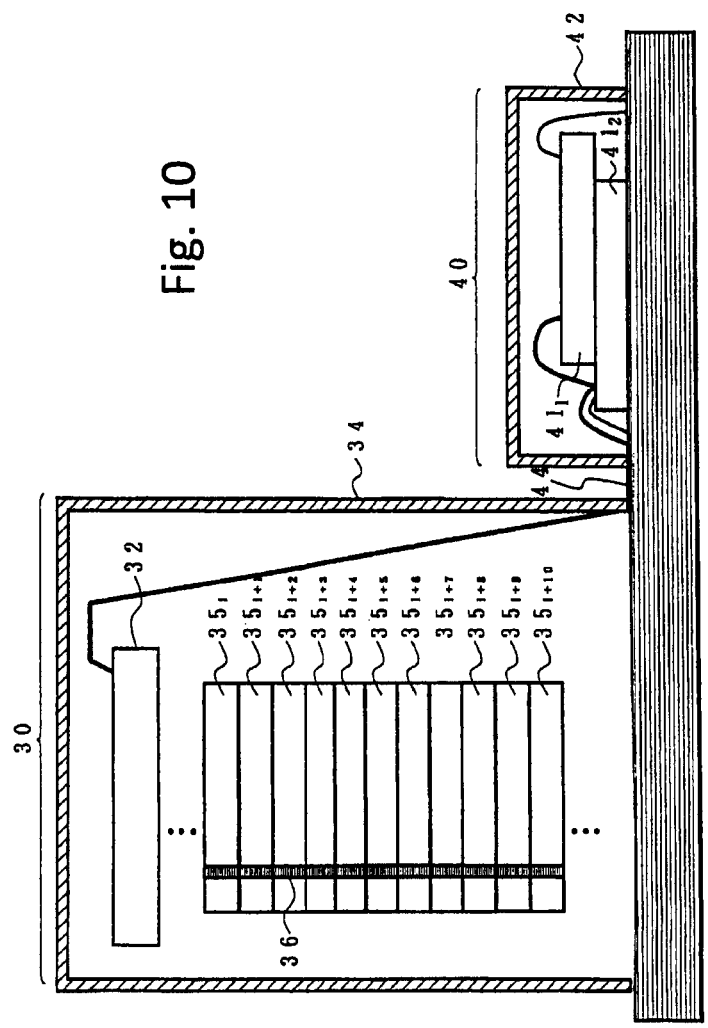
FIG. 10 is a schematic diagram showing the structure of the SSD according to the third embodiment of the present invention.

Next, the SSD according to the third embodiment of the present invention is described in reference to FIG. 10. In the third embodiment, 64 NAND memory chips $35_i$ and the controller chip 32 are connected using through silicon vias 36, and communication between the chips and the power supply is achieved via the through silicon vias 36.

In the case of the third embodiment, no wire bonding process is required, and therefore it is not necessary to take into consideration the rejection rate due to the wire bonding process.

Fourth Embodiment

Figure 11:
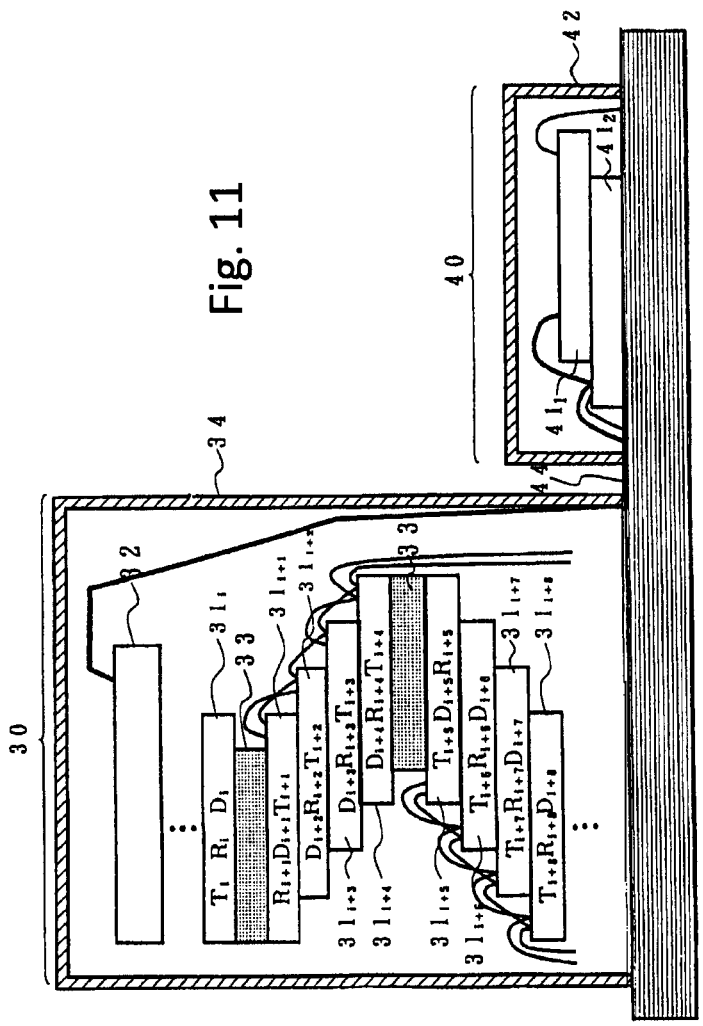
FIG. 11 is a schematic diagram showing the structure of the SSD according to the fourth embodiment of the present invention.

Next, the SSD according to the fourth embodiment of the present invention is described in reference to FIG. 11. In the fourth embodiment, the bonding wires in the SSD have redundancy, and the rest of the structure is exactly the same as the first embodiment. That is to say, 64 NAND flash memory chips $31_i$ are provided with two wires for supplying power, two wires for grounding and two wires for resetting.

Accordingly, the yield of the entire memory package, which covers the yield of the memory chips, is improved by approximately 2% or a bit less, taking into consideration the fact that the yield due to the bonding wires is 98% in the case where the bonding wires do not have redundancy.

Fifth Embodiment

Figure 12:
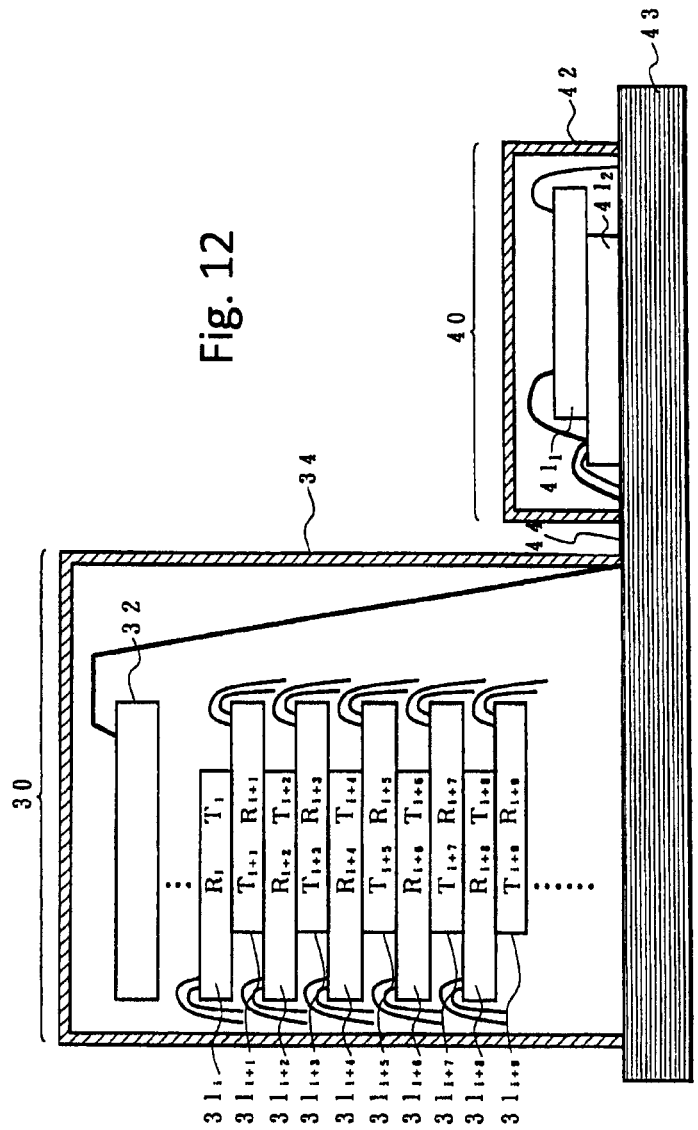
FIG. 12 is a schematic diagram showing the structure of the SSD according to the fifth embodiment of the present invention.

Next, the SSD according to the fifth embodiment of the present invention is described in reference to FIG. 12. In the fifth embodiment, the bonding wires in the SSD have a redundancy, and the rest of the structure is exactly the same as in the second embodiment. That is to say, in this case also, 64 NAND flash memory chips 31$_i$ are provided with two wires for supplying power, two wires for grounding and two wires for resetting. In this case as well, the yield of the entire memory package is improved by approximately 2% or a bit less.

Sixth Embodiment

Figure 13:
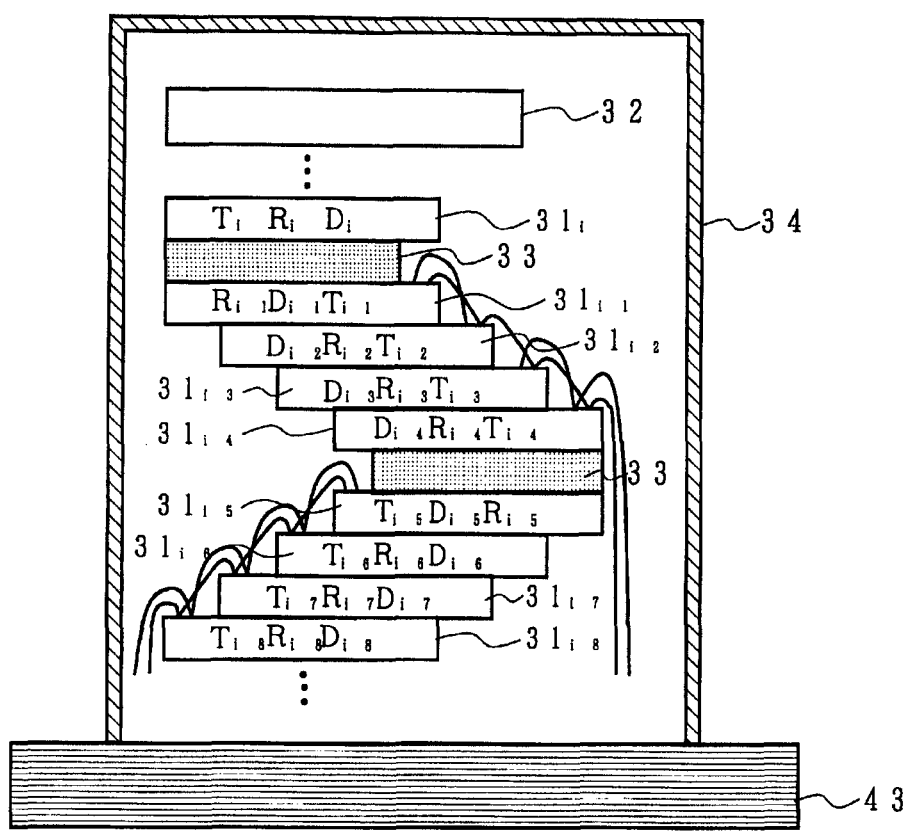
FIG. 13 is a schematic diagram showing the structure of the SSD according to the sixth embodiment of the present invention.

Next, the SSD according to the sixth embodiment of the present invention is described in reference to FIG. 13. In the sixth embodiment, the memory chips in the SSD do not have a redundancy, unlike in the first embodiment, and only the bonding wires have a redundancy. The rest of the structure is exactly the same as in the first embodiment. This structure is meaningful in the case when the rejection rate of the NAND flash memory chips 31$_i$ is quite low. In this case, the memory package, of which the yield is 14% and where only good memory chips are stacked, is provided with redundant wires before the memory package is mounted.

Seventh Embodiment

Figure 14:
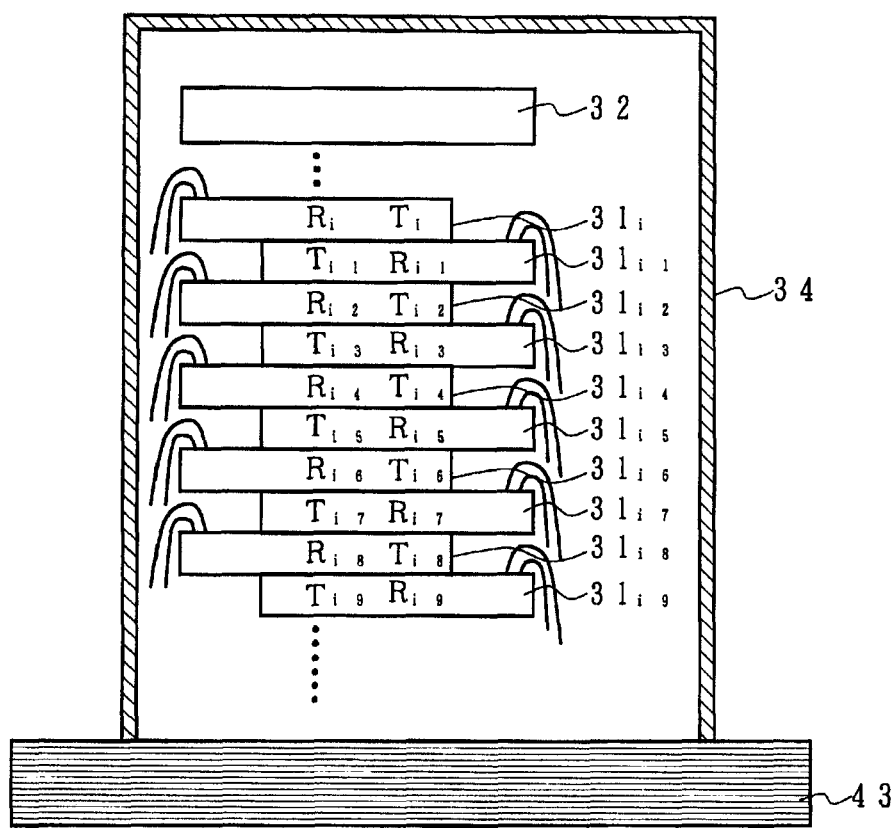
FIG. 14 is a schematic diagram showing the structure of the SSD according to the seventh embodiment of the present invention.
Figure 15:
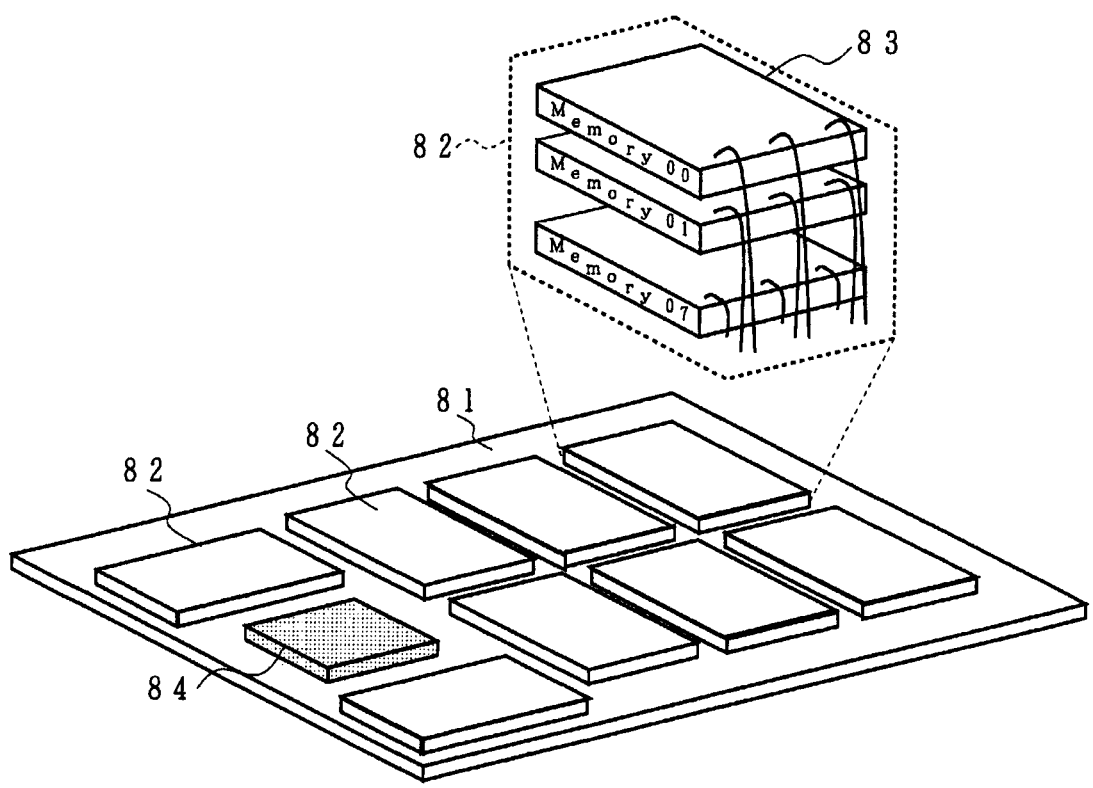
FIG. 15 is a schematic diagram showing the structure of an SSD.
Figure 16:
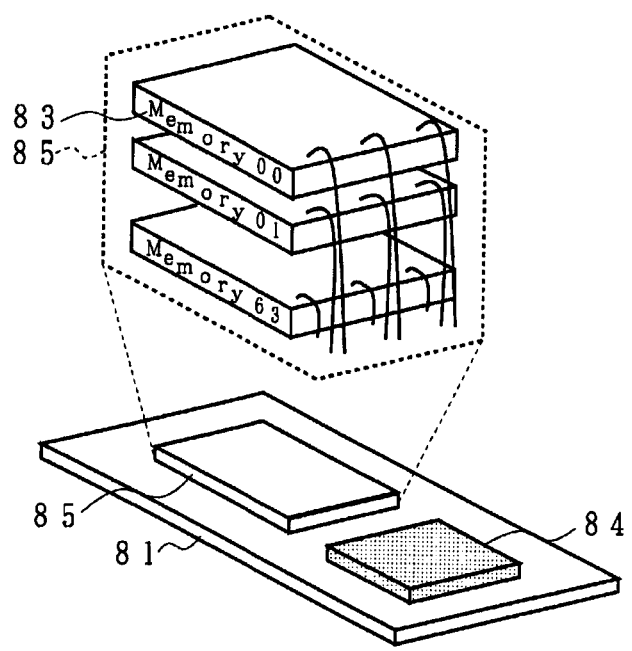
FIG. 16 is a schematic diagram showing the structure of an ultra large scale integrated SSD.

Next, the SSD according to the seventh embodiment of the present invention is described in reference to FIG. 14. In the seventh embodiment, the memory chips in the SSD do not have a redundancy, unlike in the second embodiment, and only the bonding wires have a redundancy. The rest of the structure is exactly the same as in the second embodiment. This structure is also meaningful in the case when the rejection rate of the NAND flash memory chips 31$_i$ is quite low. In this case as well, the memory package, of which the yield is 14% and where only good memory chips are stacked, is provided with redundant wires before the memory package is mounted.

Though the embodiments of the present invention are described above, the present invention is not limited to the structures in the embodiments and various modifications are possible. For example, though three coils for magnetic field communication are provided in the first embodiment, the number of coils is not limited to three. Concretely, small coils that are the same as the center coil may be provided on both sides in order to sufficiently reduce the cross talk so that large coils can be used to cover the distance of two chips and small coils can be used to cover the distance of one chip. This structure where two types of coils are used to cover different distances can be easily provided by adding a switching transistor to the transmission circuit.

INDUSTRIAL APPLICABILITY

Though typical applications for the present invention are SSDs having stacked NAND flash memory chips, the invention may also be applied to large capacity DRAMs and multi-core processors.

The invention claimed is:

1. A semiconductor device comprising:
   a substrate:
   a first device mounted on the substrate, the first device comprising
   a plurality of first semiconductor chips, and
   a second semiconductor chip, stacked with the first semiconductor chips, for controlling communication between said first semiconductor chips and the outside or communication between said first semiconductor chips are stacked; and
   a second device mounted on the substrate, the second device comprising at least one third semiconductor chip to communicate with said second semiconductor chip,
   wherein said third semiconductor chip functions to substitute one or more of the first semiconductor chips which does not properly operate.

2. The semiconductor device according to claim 1, wherein said first semiconductor chips and said second semiconductor chip have a coil for magnetic field communication, so that data is communicated between said first semiconductor chips and said second semiconductor chip, as well as between said first semiconductor chips, as magnetic field communication through inductive coupling of said coils for magnetic field communication, and said first semiconductor chips and said second semiconductor chip are connected to wires for supplying power.

3. The semiconductor device according to claim 2, wherein there are a greater number of said wires for supplying power than determined by the requirement of power consumption.

4. The semiconductor device according to claim 3, wherein each of which said first semiconductor chips has a wire for resetting the communication state of the coil for magnetic field communication provided in the first semiconductor chip and a redundant wire for resetting which functions to substitute said wire for resetting.

5. The semiconductor device according to claim 1, wherein said first semiconductor chips and said third semiconductor chips are semiconductor memory chips.

6. The semiconductor device according to claim 5, wherein said semiconductor memory chips are nonvolatile memories.

7. The semiconductor device according to claim 1, wherein said first semiconductor chips have the same structure.

8. A manufacturing method for a semiconductor device, comprising:
   mounting on a substrate a first device comprising
   a plurality of first semiconductor chips, and
   a second semiconductor chip for controlling communication between said first semiconductor chips and the outside or communication between said first semiconductor chips,
   wherein the first semiconductor chips and the second semiconductor chip are stacked together;
   testing the first device whether to determine a first number of the first semiconductor chips which do not properly operate; and
   mounting on the substrate a second device comprising the first number of third semiconductor chips that function to substitute the first semiconductor chips that do not operate in the case where one or more of the first semiconductor chips do not properly operate in said first device; and
   connecting said second semiconductor chip and said third semiconductor chips so as to make communication possible between said second semiconductor chip and said third semiconductor chips.

* * * * *